(12) United States Patent
Uda et al.

(10) Patent No.: US 10,615,789 B1
(45) Date of Patent: Apr. 7, 2020

(54) SEMICONDUCTOR DEVICE (71) Applicant: Mitsubishi Electric Corporation, Tokyo (JP)

(72) Inventors: Tatsuya Uda, Tokyo (JP); Nobutake Taniguchi, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 16/452,843

(22) Filed: Jun. 26, 2019

(30) Foreign Application Priority Data

Nov. 26, 2018 (JP) .................................. 2018-220387

(51) Int. Cl.
*H03K 17/60* (2006.01)
*H03K 17/14* (2006.01)

(52) U.S. Cl.
CPC .................................. *H03K 17/14* (2013.01)

(58) Field of Classification Search
CPC .......... H03K 7/06; H03K 17/14; H03K 17/60; H03K 17/74; H03K 17/04126; H03K 17/601; H03M 1/00; H03M 2201/4135; H01L 29/00; H01L 29/73; H01L 21/00
See application file for complete search history.

(56) References Cited

U.S. PATENT DOCUMENTS

| 2009/0128106 A1 | 5/2009 | Takahashi et al. | |
| 2013/0285712 A1* | 10/2013 | Kanschat | H03K 17/00 327/109 |
| 2016/0191042 A1* | 6/2016 | Lizama | H03K 17/0414 327/399 |

FOREIGN PATENT DOCUMENTS

WO 2006/129548 A1 12/2006

* cited by examiner

*Primary Examiner* — Long Nguyen
(74) *Attorney, Agent, or Firm* — Studebaker & Brackett PC (57) ABSTRACT

According to the present invention, a semiconductor device includes a first semiconductor device, a second semiconductor device, an AC output terminal, a first shunt resistor connected to the first semiconductor device at one end thereof and the AC output terminal at the other end thereof, a second shunt resistor connected to the second semiconductor device at one end thereof and the AC output terminal at the other end thereof, a first wiring connecting the one end of the first shunt resistor and the one end of the second shunt resistor, a second wiring connecting the other end of the first shunt resistor and the other end of the second shunt resistor and a first sense resistor circuit including a first sense resistor and a second sense resistor connected in series between the one end of the first shunt resistor and the one end of the second shunt resistor.

8 Claims, 7 Drawing Sheets

SEMICONDUCTOR DEVICE

BACKGROUND OF THE INVENTION

Field

The present invention relates to a semiconductor device.

Background

WO 2016/129548 discloses a power supply control device for controlling power supply from a power supply to a load. The power supply control device includes a semiconductor switching device that are arranged in a power supply path from the power supply to the load, a current detection circuit, a voltage generating circuit, and an abnormality detection circuit. The current detection circuit detects a load current flowing through the semiconductor switching device. The voltage generating circuit is a voltage dividing circuit for dividing an output-side voltage of the semiconductor switching device, and is formed by connecting voltage dividing resistors in series. The abnormality detection circuit outputs an abnormality signal when a load current flowing through the semiconductor switching device exceeds a threshold current corresponding to a divided voltage of the voltage generating circuit. As a result, it is possible to perform highly accurate abnormality detection.

When plural shunt resistors are connected in series, losses in the plural shunt resistors may increase. This may cause a large amount of heat from the plural shunt resistors, which may make it difficult to incorporate the plural shunt resistors into a semiconductor device.

SUMMARY

The present invention has been made to solve the foregoing problem, and has an object to provide a semiconductor device capable of suppressing heat generation caused by shunt resistors and improving current detection accuracy.

The features and advantages of the present invention may be summarized as follows.

According to the present invention, a semiconductor device includes a first semiconductor device having a first terminal, a second terminal, and a first driving terminal, wherein current flows from the first terminal to the second terminal in response to a signal input to the first driving terminal, a second semiconductor device having a third terminal, a fourth terminal, and a second driving terminal, wherein current flows from the third terminal to the fourth terminal in response to a signal input to the second driving terminal, an AC output terminal, a first shunt resistor that is electrically connected to the second terminal at one end thereof and electrically connected to the AC output terminal at the other end thereof, a second shunt resistor that is electrically connected to the third terminal at one end thereof, and electrically connected to the AC output terminal at the other end thereof, a first wiring for electrically connecting the one end of the first shunt resistor and the one end of the second shunt resistor, a second wiring for electrically connecting the other end of the first shunt resistor and the other end of the second shunt resistor and a first sense resistor circuit including a first sense resistor and a second sense resistor that are connected to each other in series between the one end of the first shunt resistor and the one end of the second shunt resistor or between the other end of the first shunt resistor and the other end of the second shunt resistor.

Other and further objects, features and advantages of the invention will appear more fully from the following description.

DESCRIPTION OF EMBODIMENTS

A semiconductor device according to an embodiment of the present invention will be described with reference to the accompanying drawings. Components identical or corresponding to each other are indicated by the same reference characters, and repeated description of them is avoided in some cases.

First Embodiment

Figure 1:
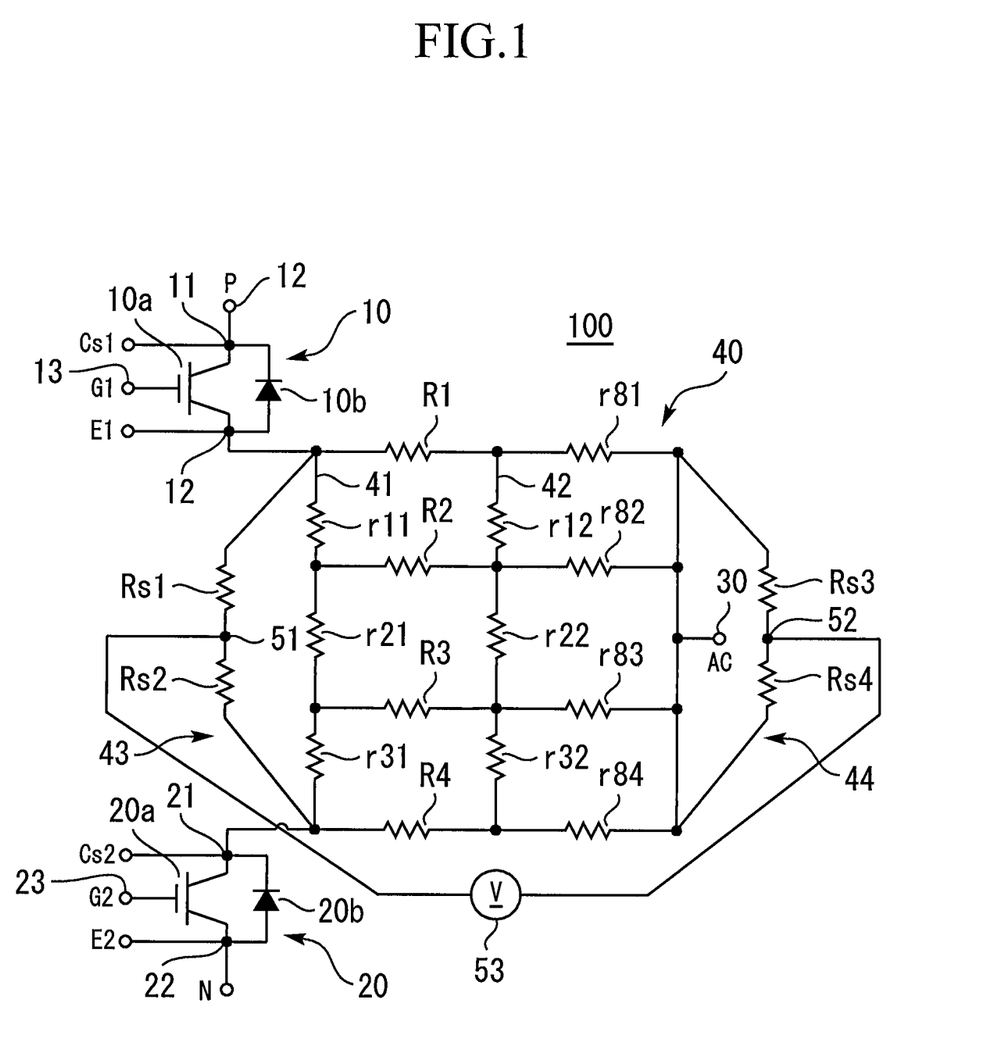
FIG. 1 is a circuit diagram showing a semiconductor device according to a first embodiment.

FIG. 1 is a circuit diagram showing a semiconductor device 100 according to a first embodiment. The semiconductor device 100 includes a first semiconductor device 10 and a second semiconductor device 20. The first semiconductor device 10 includes an IGBT (Insulated Gate Bipolar Transistor) 10*a* and a diode 10*b*. The IGBT 10*a* has a first terminal 11, a second terminal 12, and a first driving terminal 13. In the IGBT 10*a*, current flows from the first terminal 11 to the second terminal 12 in response to a signal input to the first driving terminal 13. The first terminal 11 is a collector, the second terminal 12 is an emitter, and the first driving terminal 13 is a gate.

The anode of the diode 10*b* is connected to the second terminal 12. The cathode of the diode 10*b* is connected to the first terminal 11. The diode 10*b* is a freewheeling diode.

The second semiconductor device 20 includes an IGBT 20*a* and a diode 20*b*. The IGBT 20*a* has a third terminal 21, a fourth terminal 22, and a second driving terminal 23. In the IGBT 20*a*, current flows from the third terminal 21 to the fourth terminal 22 in response to a signal input to the second driving terminal 23. The third terminal 21 is a collector, the fourth terminal 22 is an emitter, and the second driving terminal 23 is a gate. The anode of the diode 20*b* is connected to the fourth terminal 22. The cathode of the diode 20*b* is connected to the third terminal 21. The diode 20*b* is a freewheeling diode.

The semiconductor device 100 includes an AC output terminal 30. An AC voltage is output from the AC output terminal 30. For example, a load is connected to the AC output terminal 30. A power supply is connected between the first terminal 11 and the fourth terminal 22. The semiconductor device 100 is provided between the power supply and the load. The semiconductor device 100 is a power conversion device for converting a power supply voltage to an AC voltage by turning on and off the first semiconductor device 10 and the second semiconductor device, which are switching elements, and supplying the AC voltage to the load. Each of the first semiconductor device 10 and the second semiconductor device 20 may be MOSFET (Metal-Oxide-Semiconductor Field-Effect Transistor), for example.

A resistance circuit 40 is connected between the AC output terminal 30, and the first semiconductor device 10 and the second semiconductor device 20. The resistance circuit 40 includes first to fourth shunt resistors R1 to R4, and first to fourth sense resistors Rs1 to Rs4. A voltage generated in the semiconductor device 100 can be detected by the resistance circuit 40. The first to fourth shunt resistors R1 to R4 are connected in parallel. The number of shunt resistors may be a plural number. The resistance values and the number of the shunt resistors may be changed according to the current flowing through the semiconductor device 100, the magnitude of a voltage to be detected or the like.

The first shunt resistor R1 is electrically connected to the second terminal 12 at one end of the first shunt resistor R1, and electrically connected to the AC output terminal 30 at the other end of the first shunt resistor R1. The fourth shunt resistor R4 is electrically connected to the third terminal 21 at one end of the fourth shunt resistor R4, and electrically connected to the AC output terminal 30 at the other end of the fourth shunt resistor R4. A first wiring 41 electrically connects the one end of the first shunt resistor R1 to the one end of the fourth shunt resistor R4. A second wiring 42 electrically connects the other end of the first shunt resistor R1 to the other end of the fourth shunt resistor R4.

The second shunt resistor R2 is electrically connected to the first wiring 41 at one end of the second shunt resistor R2, and electrically connected to the second wiring 42 and the AC output terminal 30 at the other end of the second shunt resistor R2. The third shunt resistor R3 is electrically connected to the first wiring 41 at one end of the third shunt resistor R3 and electrically connected to the second wiring 42 and the AC output terminal 30 at the other end of the third shunt resistor R3 between the second shunt resistor R2 and the fourth shunt resistor R4.

The resistance circuit 40 has pattern resistors r11, r12, r21, r22, r31, and r32. The pattern resistors r11, r12, r21, r22, r31, and r32 contain resistance components of patterns among the shunt resistors and resistance components occurring due to soldering of the shunt resistors.

The pattern resistance r11 is the resistance of a wiring for connecting one end of the first shunt resistor R1 and one end of the second shunt resistor R2. The pattern resistance r12 is the resistance of a wiring for connecting the other end of the first shunt resistor R1 and the other end of the second shunt resistor R2. The pattern resistance r21 is the resistance of a wiring for connecting one end of the second shunt resistor R2 and one end of the third shunt resistor R3. The pattern resistance r22 is the resistance of a wiring for connecting the other end of the second shunt resistor R2 and the other end of the third shunt resistor R3. The pattern resistance r31 is the resistance of a wiring for connecting one end of the third shunt resistor R3 and one end of the fourth shunt resistor R4. The pattern resistance r32 is the resistance of a wiring for connecting the other end of the third shunt resistor R3 and the other end of the fourth shunt resistor R4.

The resistance circuit 40 has wiring resistors r81 to r84. The wiring resistors r81 to r84 are resistance components of the wirings for connecting the other ends of the first to fourth shunt resistors R1 to R4 and the AC output terminal 30. In the present embodiment, the first to fourth shunt resistors R1 to R4 and the AC output terminal 30 are connected to each other by wire bonding. The wiring resistors r81 to r84 are resistance components caused by the wire bonding.

The wiring resistance r81 is the resistance of a wiring for connecting the other end of the first shunt resistor R1 and the AC output terminal 30. The wiring resistance r82 is the resistance of a wiring for connecting the other end of the second shunt resistor R2 and the AC output terminal 30. The wiring resistance r83 is the resistance of a wiring for connecting the other end of the third shunt resistor R3 and the AC output terminal 30. The wiring resistance r84 is the resistance of a wiring for connecting the other end of the fourth shunt resistor R4 and the AC output terminal 30.

The resistance circuit 40 has a first sense resistor circuit 43. The first sense resistor circuit 43 is electrically connected between one end of the first shunt resistor R1 and one end of the second shunt resistor R2. The first sense resistor circuit 43 has the first sense resistor Rs1 and the second sense resistor Rs2 which are connected to each other in series. Furthermore, the resistance circuit 40 includes a second sense resistor circuit 44. The second sense resistor circuit 44 is electrically connected between the other end of the first shunt resistor R1 and the other end of the second shunt resistor R2. The second sense resistor circuit 44 has the third sense resistor Rs3 and the fourth sense resistor Rs4 which are connected to each other in series.

The semiconductor device 100 includes a first voltage detection terminal 51 and a second voltage detection terminal 52. The first voltage detection terminal 51 is electrically connected to a connection point between the first sense resistor Rs1 and the second sense resistor Rs2. The second voltage detection terminal 52 is electrically connected to a connection point between the third sense resistor Rs3 and the fourth sense resistor Rs4.

A voltage detector 53 is electrically connected between the first voltage detection terminal 51 and the second voltage detection terminal 52. The voltage detector 53 detects a voltage applied between the first voltage detection terminal 51 and the second voltage detection terminal 52. The voltage detector 53 can detect a composite voltage of the resistance circuit 40. In the present embodiment, the composite voltage of the resistance circuit 40 is a voltage to be applied to both the ends of a series circuit formed by the first sense resistor Rs1, the first shunt resistor R1, and the third sense resistor Rs3. Furthermore, the composite voltage of the resistance circuit 40 may be a voltage to be applied to both the ends of a series circuit formed by the second sense resistor Rs2, the fourth shunt resistor R4, and the fourth sense resistor Rs4.

Figure 2:
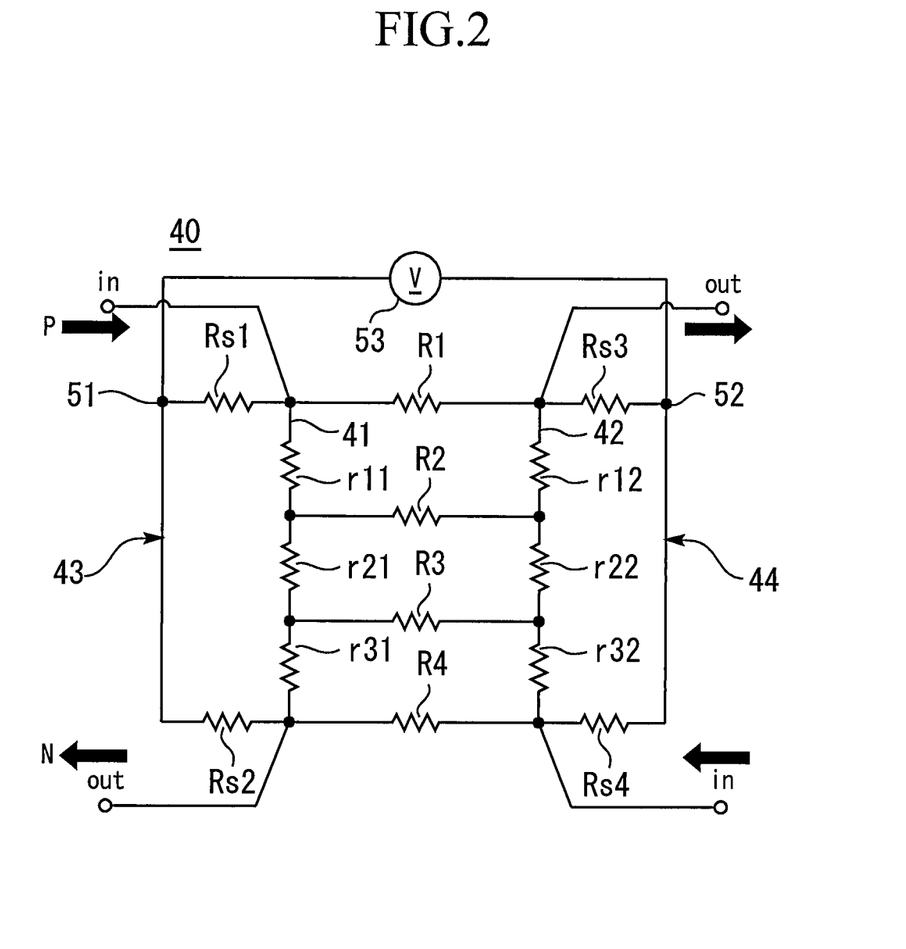
FIG. 2 is a circuit diagram of the resistance circuit according to the first embodiment.

FIG. 2 is a circuit diagram of the resistance circuit 40 according to the first embodiment. Arrows indicate directions of current flow. In FIG. 2, current flows from left to right on a P-side. That is, current flows from the first semiconductor device 10 to the AC output terminal 30. Furthermore, current flows from right to left on an N-side. That is, current flows from the AC output terminal 30 to the second semiconductor device 20.

Figure 3:
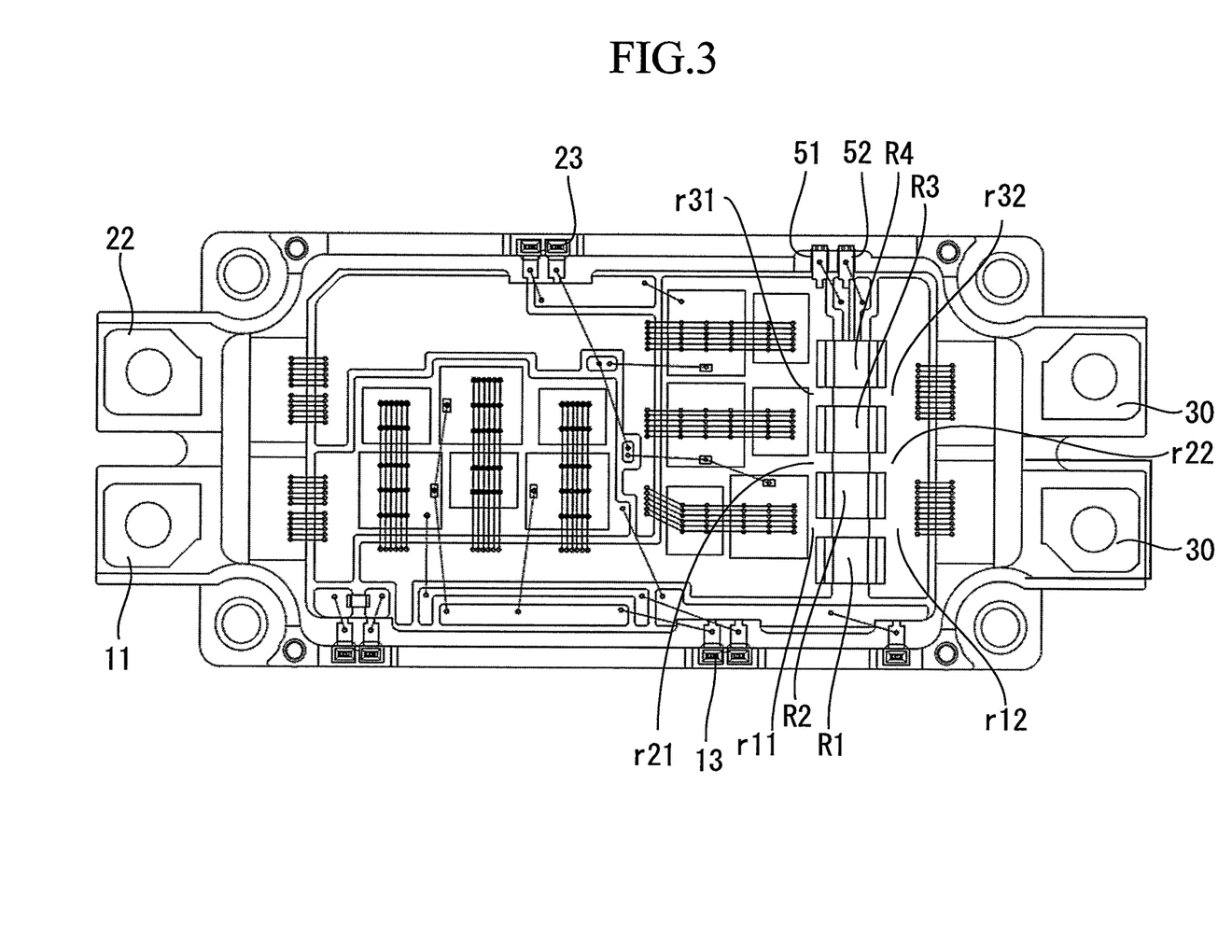
FIG. 3 is a plan view of the semiconductor device according to the first embodiment.

FIG. 3 is a plan view of the semiconductor device according to the first embodiment. The terminals of the first semiconductor device 10 and the second semiconductor device 20 and the AC output terminal 30 are provided on the outer peripheral portion of the semiconductor device 100. The first terminal 11 and the fourth terminal 22 are main electrode terminals connected to a power supply. The AC output terminal 30 is provided on an opposite side to the main electrode terminals with respect to the first to fourth shunt resistors R1 to R4.

The first voltage detection terminal 51 and the second voltage detection terminal 52 are provided in the vicinity of the resistance circuit 40 at the outer peripheral portion of the semiconductor device 100. In FIG. 3, the first sense resistor circuit 43 and the second sense resistor circuit 44 are omitted for the sake of convenience.

Figure 4:
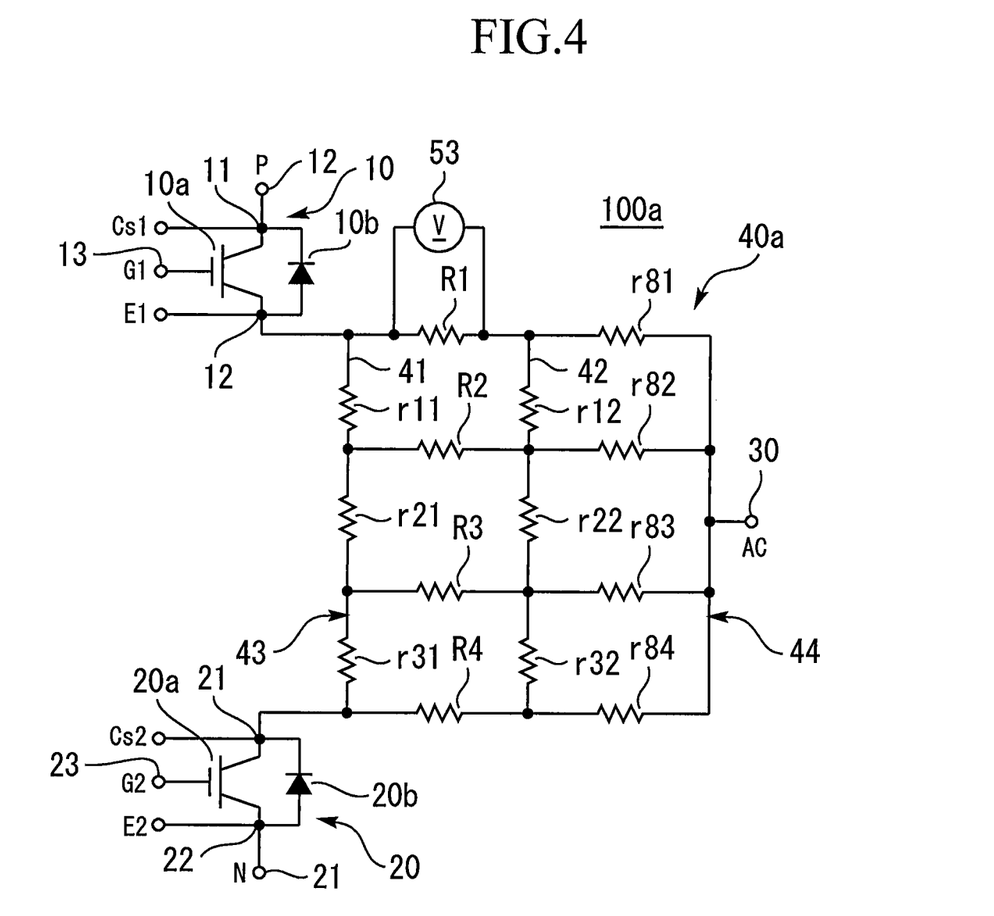
FIG. 4 is a circuit diagram of a semiconductor device according to a comparative example.
Figure 5:
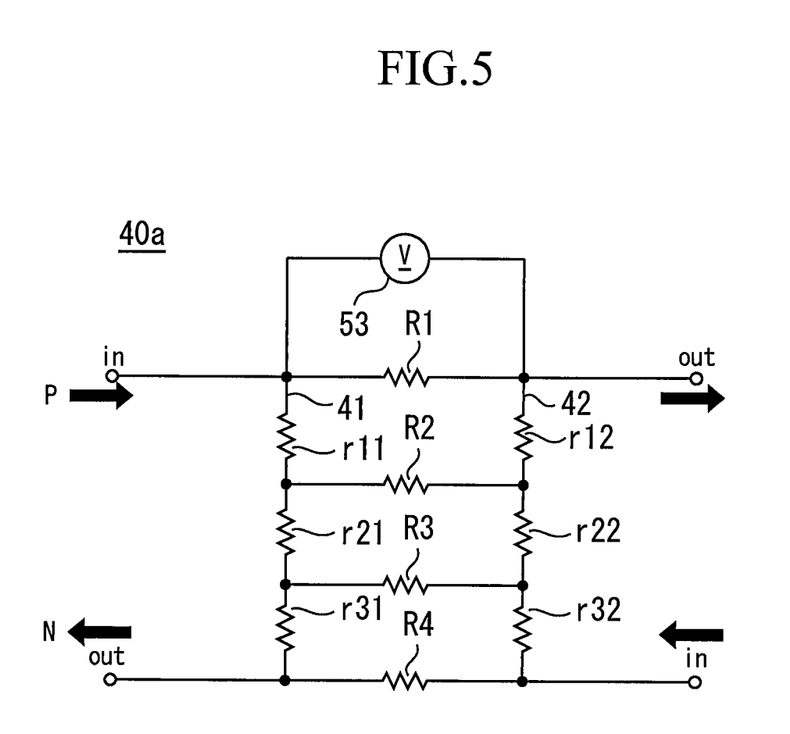
FIG. 5 is a circuit diagram of a resistance circuit according to the comparative example.

FIG. 4 is a circuit diagram of a semiconductor device according to a comparative example. FIG. 5 is a circuit diagram of a resistance circuit according to the comparative example. The semiconductor device 100a according to the comparative example includes a resistance circuit 40a. The resistance circuit 40a does not have the first sense resistor circuit 43 and the second sense resistor circuit 44.

As shown in FIG. 5, current flows from the first semiconductor device 10 to the AC output terminal 30 on the P-side. Furthermore, current flows from the AC output terminal 30 to the second semiconductor device 20 on the N-side. At this time, main current flowing from the P-side flows into the resistance circuit 40a from the first shunt resistance R1 side out of the first to fourth shunt resistors R1 to R4 which are connected in parallel. At this time, current I(n) flowing through each shunt resistor satisfies I(1)>I(2)>I(3)>I(4). Here, I(1) to I(4) represents currents flowing through the first to fourth shunt resistors R1 to R4, respectively.

Furthermore, main current flowing to the N-side flows into the second semiconductor device 20 from the fourth shunt resistor R4 side out of the first to fourth shunt resistors R1 to R4 which are connected in parallel. At this time, the current I(n) flowing through each shunt resistor satisfies I(1)<I(2)<I(3)<I(4). As described above, the ratio of the currents flowing through the first to fourth shunt resistors R1 to R4 varies depending on the current flowing direction.

From the foregoing, when plural shunt resistors are connected in parallel, the current value flowing through each shunt resistor varies depending on the direction of the current. Therefore, for example, the voltage applied to the second shunt resistor R2 varies depending on the direction of the current. Therefore, when the current value flowing through the semiconductor device 100a is calculated by using the voltage value read from the voltage detector 53, an error occurs between the calculated value and the current actually flowing in the semiconductor device 100a.

In the resistance circuit 40a according to the comparative example, an error of the current value was equal to 2.9% for even the shunt resistance having the smallest error from a true value among the plural shunt resistors. Here, the resistance values of the first to fourth shunt resistors R1 to R4 was set to 1.0 mΩ, and the resistance values of the pattern resistors r11, r12, r21, r22, r31, and r32 were set to 10 μΩ. Generally, the tolerance of the shunt resistor itself is equal to about 0.5% to 2%. For this reason, an error of 3 to 5% occurs in the current value. Therefore, it is impossible to perform accurate current control.

Figure 6:
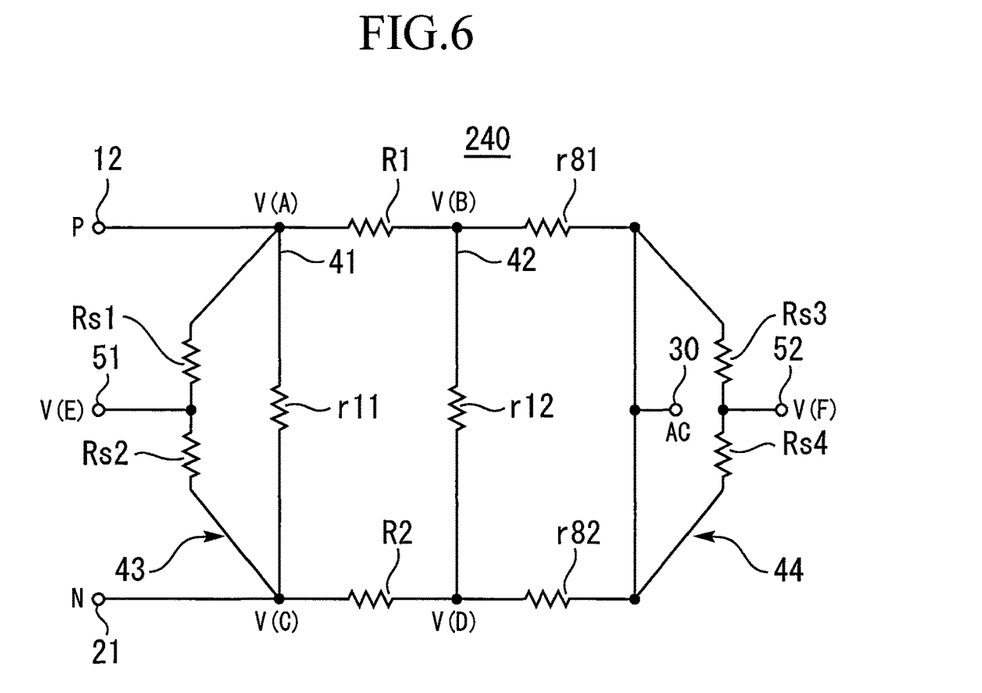
FIG. 6 is a circuit diagram showing a resistance circuit according to a first modification of the first embodiment.

Next, an effect of the present embodiment will be described. FIG. 6 is a circuit diagram showing a resistance circuit according to a first modification of the first embodiment. For the sake of simplicity, description will be made by using a resistance circuit 240 having two shunt resistors.

Voltages V(R1) and V(R2) applied to the first shunt resistor R1 and the second shunt resistor R2 respectively satisfy V(R1)=V(A)−V(B) and V(R2)=V(C)−V(D). Here, V(A) represents the potential at one end of the first shunt resistor R1. V(B) represents the potential at the other end of the first shunt resistor R1. V(C) represents the potential at one end of the second shunt resistor R2. V(D) represents the potential at the other end of the second shunt resistor R2. The first wiring 41 is provided with the pattern resistor r11. Therefore, V(A) and V(C) have different values. Likewise, the second wiring 42 is provided with the pattern resistor r12. Therefore, V(B) and V(D) have different values.

A voltage V applied between the first voltage detection terminal 51 and the second voltage detection terminal 52 satisfies V=V(E)−V(F). Here, V(E) represents the potential of the first voltage detection terminal 51, and V(F) represents the potential of the second voltage detection terminal 52. Here, for the sake of simplicity, Rs1=Rs2 and Rs3=Rs4 are assumed. At this time, the voltage V=V(E)−V(F)=((V(A)+V(C))−(V(B)+V(D)))/2=(V(A)−V(B)+V(C)−V(D))/2=(V(R1)+V(R2))/2. Accordingly, the voltage detected by the voltage detector 53 is equal to an average value of voltages occurring in the plural shunt resistors.

Likewise, even when the resistance values of the first to fourth sense resistors Rs1 to Rs4 are different from one another and when the number of the shunt resistors is equal to three or more, the voltage detected by the voltage detector 53 can be brought close to the average value of the voltages occurring in the plural shunt resistors by providing the sense resistors. At this time, the error of the detected voltage caused by the current flowing direction can be reduced.

Even when the sense resistors are provided, the current value flowing through each shunt resistor varies depending on the current flowing direction. However, the sense resistors bring the composite voltage of the resistance circuit 40 close to the average value of the voltages occurring in the plural shunt resistors. Therefore, the error of the detected voltage caused by the current flowing direction can be reduced, and the accuracy of the detected voltage can be improved. Therefore, currents in the forward direction and the reverse direction can be detected with high accuracy.

When the resistance circuit 40 according to the first embodiment is used, the error of the current value can be reduced to 0.39%. Here, the resistance values of the first to fourth shunt resistors R1 to R4 are set to 1.0 mΩ, the resistance values of the pattern resistors r11, r12, r21, r22, r31, and r32 are set to 10 μΩ, and the resistance values of the first to fourth sense resistors Rs1 to Rs4 are set to 1 kΩ. However, the resistance values of the first to fourth shunt resistors R1 to R4 and the first to fourth sense resistors Rs1 to Rs4 are not limited to the above values.

The improvement of the current detection accuracy makes it possible to perform highly accurate current control and overcurrent limiting of the semiconductor device 100. Therefore, when the semiconductor device 100 is used in, for example, an apparatus for power generation and power transmission, efficient use and reproduction of energy can be achieved. The semiconductor device 100 is not limited to the above apparatus, and can be applied to any apparatus utilizing AC power.

In the present embodiment, the plural shunt resistors are connected in parallel with respect to the AC output terminal 30. Therefore, as compared with a case where plural shunt resistors are connected in series with respect to the AC output terminal 30, heat generation of the shunt resistors can be suppressed. Therefore, in the present embodiment, it is possible to improve the current detection accuracy while suppressing the heat generation of the shunt resistors.

The resistance values of the first to fourth sense resistors Rs1 to Rs4 are equal to $10^2$ to $10^5 \Omega$ and the resistance values of the first to fourth shunt resistors R1 to R4 are equal to $10^{-4}$ to $10^{-3}\Omega$. The resistance values of the first to fourth sense resistors Rs1 to Rs4 are sufficiently larger than the resistance values of the first to fourth shunt resistors R1 to R4. The resistance values of the first to fourth sense resistors Rs1 to Rs4 are at least $10^5$ to $10^8$ times as large as the resistance values of the first to fourth shunt resistors R1 to R4. For this reason, currents flowing through the shunt resistors do not vary greatly as compared with a case where no sense resistor is provided. Accordingly, heat generation of the resistance circuit 40 can be effectively suppressed by the parallel circuit of the plural shunt resistors.

Figure 7:
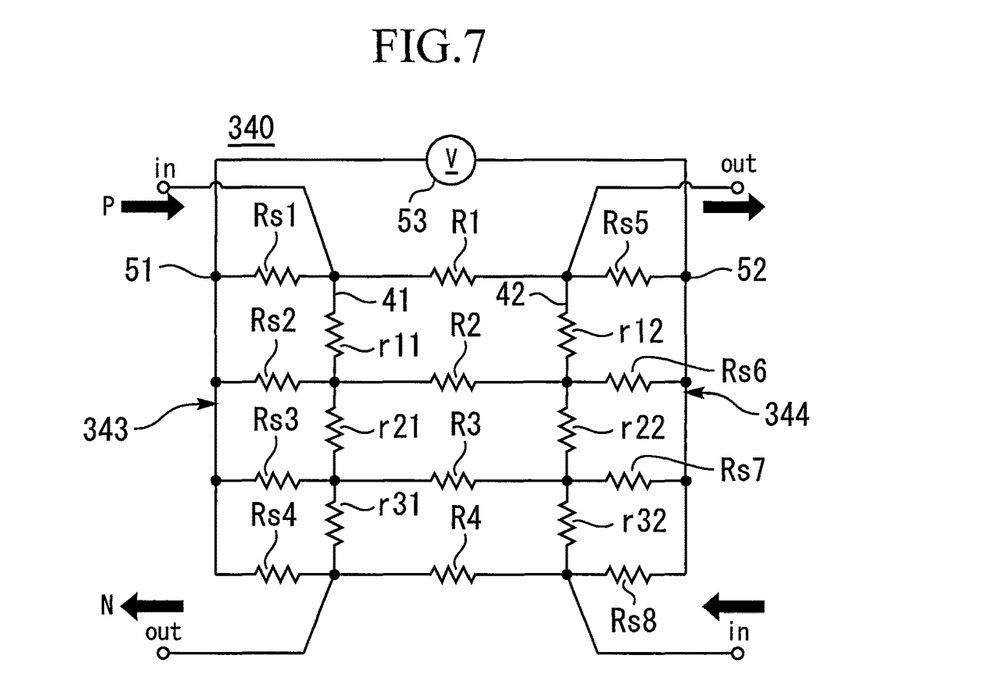
FIG. 7 is a circuit diagram of a resistance circuit according to a second modification of the first embodiment.

FIG. 7 is a circuit diagram of a resistance circuit according to a second modification of the first embodiment. A resistance circuit 340 according to the second modification includes a first sense resistor circuit 343 and a second sense resistor circuit 344. The first sense resistor circuit 343 includes first to fourth sense resistors Rs1 to Rs4. The second sense resistor circuit 344 includes fifth to eighth sense resistors Rs5 to Rs8.

In the first sense resistor circuit 343, one ends of the first to fourth sense resistors Rs1 to Rs4 are electrically connected to one ends of the first to fourth shunt resistors R1 to R4, respectively. The other ends of the first to fourth sense resistors Rs1 to Rs4 are electrically connected to one another. That is, one end of the second sense resistor Rs2 is electrically connected to one end of the second shunt resistor R2, and the other end of the second sense resistor Rs2 is electrically connected to a wiring for connecting the first sense resistor Rs1 and the fourth sense resistor Rs4. One end of the third sense resistor Rs3 is electrically connected to one end of the third shunt resistor R3, and the other end of the third sense resistor Rs3 is electrically connected to the wiring for connecting the first sense resistor Rs1 and the fourth sense resistor Rs4.

In the second sense resistor circuit 344, one ends of the fifth to eighth sense resistors Rs5 to Rs8 are electrically connected to the other ends of the first to fourth shunt resistors R1 to R4, respectively. The other ends of the fifth to eighth sense resistors Rs5 to Rs8 are electrically connected to one another. That is, one end of the sixth sense resistor Rs6 is electrically connected to the other end of the second shunt resistor R2, and the other end of the sixth sense resistor Rs6 is electrically connected to a wiring for connecting the fifth sense resistor Rs5 and the eighth sense resistor Rs8. One end of the seventh sense resistor Rs7 is electrically connected to the other end of the third shunt resistor R3, and the other end of the seventh sense resistor Rs7 is electrically connected to the wiring for connecting the fifth sense resistor Rs 5 and the eighth sense resistor Rs8.

In the resistance circuit 340, the sense resistors are connected to all the shunt resistors. As a result, the composite voltage of the resistance circuit 340 can be further brought close to the average value of the voltages occurring in the plural shunt resistors. Accordingly, the error of the detected voltage caused by the current flowing direction can be reduced, and the current detection accuracy can be further improved. When the resistance circuit 340 is used, the error of the current value can be reduced to 0.05%.

The first voltage detection terminal 51 and the second voltage detection terminal 52 are provided so as to sandwich a series circuit formed by the first sense resistor Rs1, the first shunt resistor R1, and the fifth sense resistor Rs5 therebetween in the resistance circuit 340. The first voltage detection terminal 51 and the second voltage detection terminal 52 may be provided at different positions. For example, the first voltage detection terminal 51 and the second voltage detection terminal 52 may be provided so as to sandwich a series circuit formed by the third sense resistor Rs3, the third shunt resistor R3, and the seventh sense resistor Rs7 therebetween.

Figure 8:
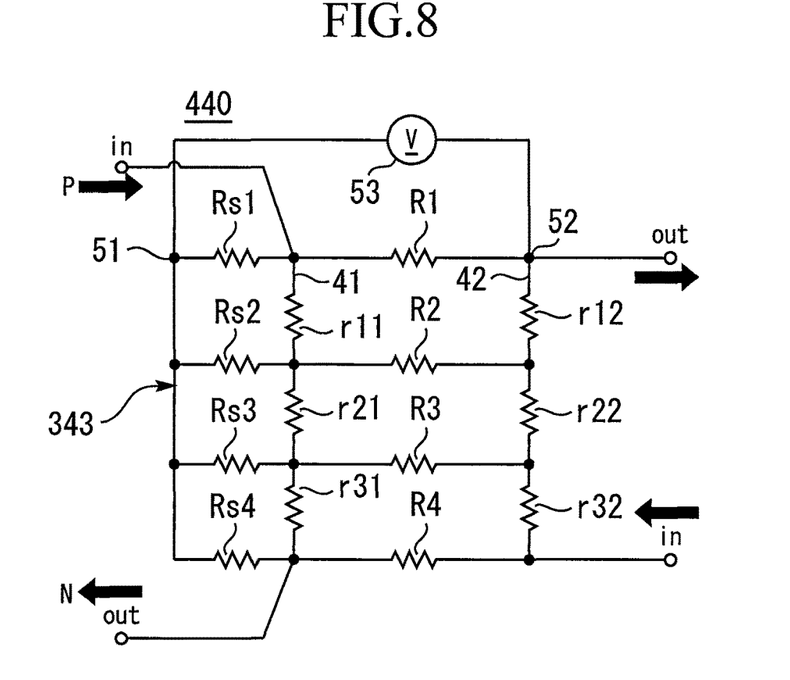
FIG. 8 is a circuit diagram showing a resistance circuit according to a third modification of the first embodiment.

FIG. 8 is a circuit diagram showing a resistance circuit according to a third modification of the first embodiment. A resistance circuit 440 according to the third modification is different from the resistance circuit 340 in that the second sense resistor circuit 344 is not provided. Furthermore, the second voltage detection terminal 52 is electrically connected to the other end of the first shunt resistor R1.

In the resistance circuit 440, the number of parts can be reduced as compared with the resistance circuit 340. Therefore, the semiconductor device 100 can be reduced in size. In addition, even when the resistance circuit 440 is used, the error of the detected voltage caused by the current flowing direction can be reduced, and the current detection accuracy can be improved. When the resistance circuit 440 is used, the error of the current value can be reduced to 0.06%.

As described above, the sense resistor circuit may be provided only on one side of the parallel circuit of the plural shunt resistors. That is, the first sense resistor circuit 343 may be electrically connected between one end of the first shunt resistor R1 and one end of the fourth shunt resistor R4, or between the other end of the first shunt resistor R1 and the other end of the fourth shunt resistor R4.

At this time, the second voltage detection terminal 52 may be electrically connected to a portion on an opposite side to the first voltage detection terminal 51 with respect to the first to fourth shunt resistors R1 to R4 in the resistance circuit 440. The second voltage detection terminal 52 is electrically connected to, for example, an end portion of any one of the first to fourth shunt resistors R1 to R4, which is located on an opposite side to the first sense resistor circuit 343.

Figure 9:
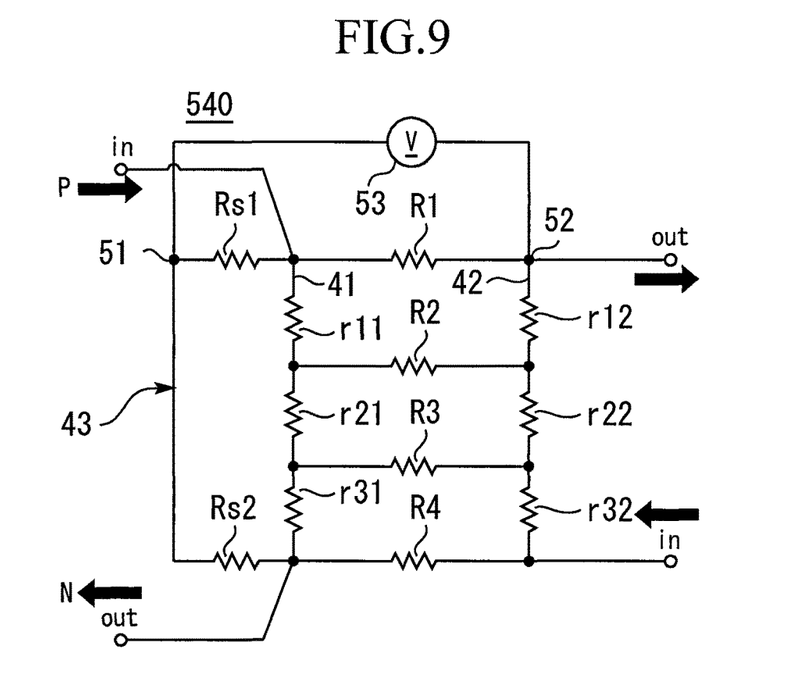
FIG. 9 is a circuit diagram showing a resistance circuit according to a fourth modification of the first embodiment.

FIG. 9 is a circuit diagram showing a resistance circuit according to a fourth modification of the first embodiment. A resistance circuit 540 according to the fourth modification is different from the resistance circuit 40 in that the second sense resistor circuit 44 is not provided. Furthermore, the second voltage detection terminal 52 is provided at the other end of the first shunt resistor R1. As a result, the number of parts can be further reduced as compared with the resistance circuit 440. Accordingly, the semiconductor device 100 can be miniaturized. Furthermore, even when the resistance circuit 540 is used, the error of the detected voltage caused by the current flowing direction can be reduced, and the current detection accuracy can be improved. When the resistance circuit 540 is used, the error of the current value can be reduced to 0.46%.

The first semiconductor device 10 and the second semiconductor device 20 may be formed by wide-band-gap semiconductors. Wide-band-gap semiconductors are made of silicon carbide, gallium-nitride based material or diamond. As a result, the semiconductor device 100 can be further miniaturized.

Meanwhile, technical features explained in this embodiment may be appropriately combined to use.

In the semiconductor device according to the present invention, the plurality of shunt resistors is connected in parallel. Therefore, heat generation caused by the plurality of shunt resistors can be suppressed. Furthermore, by providing the first sense resistor and the second sense resistor, a composite voltage of a resistance circuit including the plurality of shunt resistors and the first sense resistor and the second sense resistor can be brought close to an average value of the voltages generated in the plurality of shunt resistors. Therefore, the current detection accuracy can be improved.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2018-220387, filed on Nov. 26, 2018 including specification, claims, drawings and summary, on which the Convention priority of the present application is based, are incorporated herein by reference in its entirety.

The invention claimed is:

1. A semiconductor device comprising:
a first semiconductor device having a first terminal, a second terminal, and a first driving terminal, wherein current flows from the first terminal to the second terminal in response to a signal input to the first driving terminal;
a second semiconductor device having a third terminal, a fourth terminal, and a second driving terminal, wherein current flows from the third terminal to the fourth terminal in response to a signal input to the second driving terminal;
an AC output terminal;
a first shunt resistor that is electrically connected to the second terminal at one end thereof and electrically connected to the AC output terminal at the other end thereof;
a second shunt resistor that is electrically connected to the third terminal at one end thereof, and electrically connected to the AC output terminal at the other end thereof;
a first wiring for electrically connecting the one end of the first shunt resistor and the one end of the second shunt resistor;
a second wiring for electrically connecting the other end of the first shunt resistor and the other end of the second shunt resistor; and
a first sense resistor circuit including a first sense resistor and a second sense resistor that are connected to each other in series between the one end of the first shunt resistor and the one end of the second shunt resistor or between the other end of the first shunt resistor and the other end of the second shunt resistor.

2. The semiconductor device according to claim 1, further comprising:
a first voltage detection terminal that is electrically connected to a connection point between the first sense resistor and the second sense resistor; and
a second voltage detection terminal that is electrically connected to a portion on an opposite side to the first voltage detection terminal with respect to the first shunt resistor and the second shunt resistor.

3. The semiconductor device according to claim 1, further comprising a second sense resistor circuit including a third sense resistor and a fourth sense resistor that are connected to each other in series between the other end of the first shunt resistor and the other end of the second shunt resistor,
wherein the first sense resistor circuit is electrically connected between the one end of the first shunt resistor and the one end of the second shunt resistor.

4. The semiconductor device according to claim 3, further comprising:
a first voltage detection terminal that is electrically connected to a connection point between the first sense resistor and the second sense resistor; and
a second voltage detection terminal that is electrically connected to a connection point between the third sense resistor and the fourth sense resistor.

5. The semiconductor device according to claim 2, wherein the second voltage detection terminal is electrically connected to an end portion of the first shunt resistor on an opposite side to the first sense resistor circuit or an end portion of the second shunt resistor on an opposite side to the first sense resistor circuit.

6. The semiconductor device according to claim 1, further comprising a third shunt resistor that is electrically connected to the first wiring at one end thereof and electrically connected to the second wiring and the AC output terminal at the other end thereof,
wherein the first sense resistor circuit includes a fifth sense resistor that is electrically connected to one end of the third shunt resistor at one end thereof and electrically connected to a wiring for connecting the first sense resistor and the second sense resistor at the other end thereof.

7. The semiconductor device according to claim 1, wherein the first semiconductor device or the second semiconductor device is made with a wide bandgap semiconductor.

8. The semiconductor device according to claim 7, wherein the wide bandgap semiconductor is silicon carbide, gallium-nitride based material or diamond.

* * * * *